(12) United States Patent
Li

(10) Patent No.: US 8,248,275 B2
(45) Date of Patent: Aug. 21, 2012

(54) KEY CODING CIRCUIT

(75) Inventor: Jian-Hui Li, Shenzhen (CN)

(73) Assignees: Shenzhen Futaihong Precision Industry Co., Ltd., ShenZhen, Guangdong Province (CN); FIH (Hong Kong) Limited, Kowloon (HK)

(*) Notice: Subject to any disclaimer, the term of this patent is extended or adjusted under 35 U.S.C. 154(b) by 351 days.

(21) Appl. No.: 12/750,843

(22) Filed: Mar. 31, 2010

(65) Prior Publication Data
US 2011/0115653 A1 May 19, 2011

(30) Foreign Application Priority Data
Nov. 19, 2009 (CN) .......................... 2009 1 0310021

(51) Int. Cl.
*H03M 11/00* (2006.01)
(52) U.S. Cl. ............... 341/22; 341/26; 341/34; 345/168; 345/173; 345/174
(58) Field of Classification Search ............ 341/22, 341/26, 34; 345/168, 173, 174
See application file for complete search history.

(56) References Cited

U.S. PATENT DOCUMENTS

| 4,293,849 | A | * | 10/1981 | Lacy | 341/24 |
|---|---|---|---|---|---|
| 4,408,184 | A | * | 10/1983 | Ishii | 341/26 |
| 4,555,693 | A | * | 11/1985 | Danish et al. | 341/5 |
| 4,570,154 | A | * | 2/1986 | Kinghorn et al. | 341/26 |
| 4,725,816 | A | * | 2/1988 | Petterson | 341/24 |
| 5,189,416 | A | * | 2/1993 | Estes | 341/26 |
| 5,856,794 | A | * | 1/1999 | Chang | 341/26 |
| 6,020,833 | A | * | 2/2000 | Chang et al. | 341/26 |
| 6,538,582 | B1 | * | 3/2003 | Lin et al. | 341/22 |
| 7,391,342 | B1 | * | 6/2008 | Mui | 341/22 |
| 7,439,955 | B2 | * | 10/2008 | Barthelet et al. | 345/168 |
| 7,541,946 | B2 | * | 6/2009 | Fedigan | 341/29 |
| 7,849,240 | B2 | * | 12/2010 | Guan et al. | 710/67 |

* cited by examiner

*Primary Examiner* — Linh Nguyen
(74) *Attorney, Agent, or Firm* — Altis Law Group, Inc.

(57) ABSTRACT

A key coding circuit includes N keys, a signal processing unit, a bus, and a ground wire, and each key includes an input end and a ground end electrically connected to the ground wire. The signal processing unit includes M signal lines, where M is the smallest positive whole number not less than Log(N+1, 2), and at least one signal line is electrically connected to the corresponding input end. Each key is coded for M-bit binary, the floating signal lines correspond to the binary code 1, and the signal lines corresponding to binary code 0 are electrically connected to the input end of the corresponding keys.

7 Claims, 4 Drawing Sheets

KEY CODING CIRCUIT

BACKGROUND

1. Technical Field

The disclosure generally relates to coding circuits, and particularly, to a key coding circuit used in electronic devices.

2. Description of the Related Art

Various matrix scanning circuits are widely used in different electronic devices with keypad input, such as mobile phones and notebook computers, whereby the keys are scanned to confirm activation thereof. FIG. 3 shows an existing matrix key circuit including keys S0~S15 and a key coding circuit 10.

The key coding circuit 10 includes line output ports PA0~PA3 and column output ports PA4~PA7. Both ends of each key are respectively connected to a line output port and a column output port. In use, the key coding circuit 10 provides high levels sequentially to the output ports PA0~PA3 and provides low levels to the output ports PA4~PA7. When any key is used, the high level of the line output port is converted to low level; the key coding circuit 10 detects the level changes to read corresponding procedures, resulting in scanning matrix keys line by line to indentify the specific location of the used key, which increases the scan time.

Therefore, there is room for improvement within the art.

BRIEF DESCRIPTION OF THE DRAWINGS

Many aspects of a key coding circuit can be better understood with reference to the following drawings. The components in the drawings are not necessarily drawn to scale, the emphasis instead being placed upon clearly illustrating the principles of the exemplary key coding circuit. Moreover, in the drawings, like reference numerals designate corresponding parts throughout the several views. Wherever possible, the same reference numbers are used throughout the drawings to refer to the same or like elements of an embodiment.

DETAILED DESCRIPTION

An exemplary embodiment of a key coding circuit of an electronic device uses binary codes, the number of which depends on the number of keys. The number of keys can be defined as N, and the number of the codes as M. Accordingly, the number of the codes is obtained by the following formula: M=INT [Log(N+1, 2)], wherein 2 is a base number of the logarithm Log(N+1, 2), and INT(X) represents the smallest integer no less than X. For example, the electronic device includes 21 keys, namely N=21, then M=5 according to the above formula; if N=101, then M=7 according to the above formula.

Figure 1:
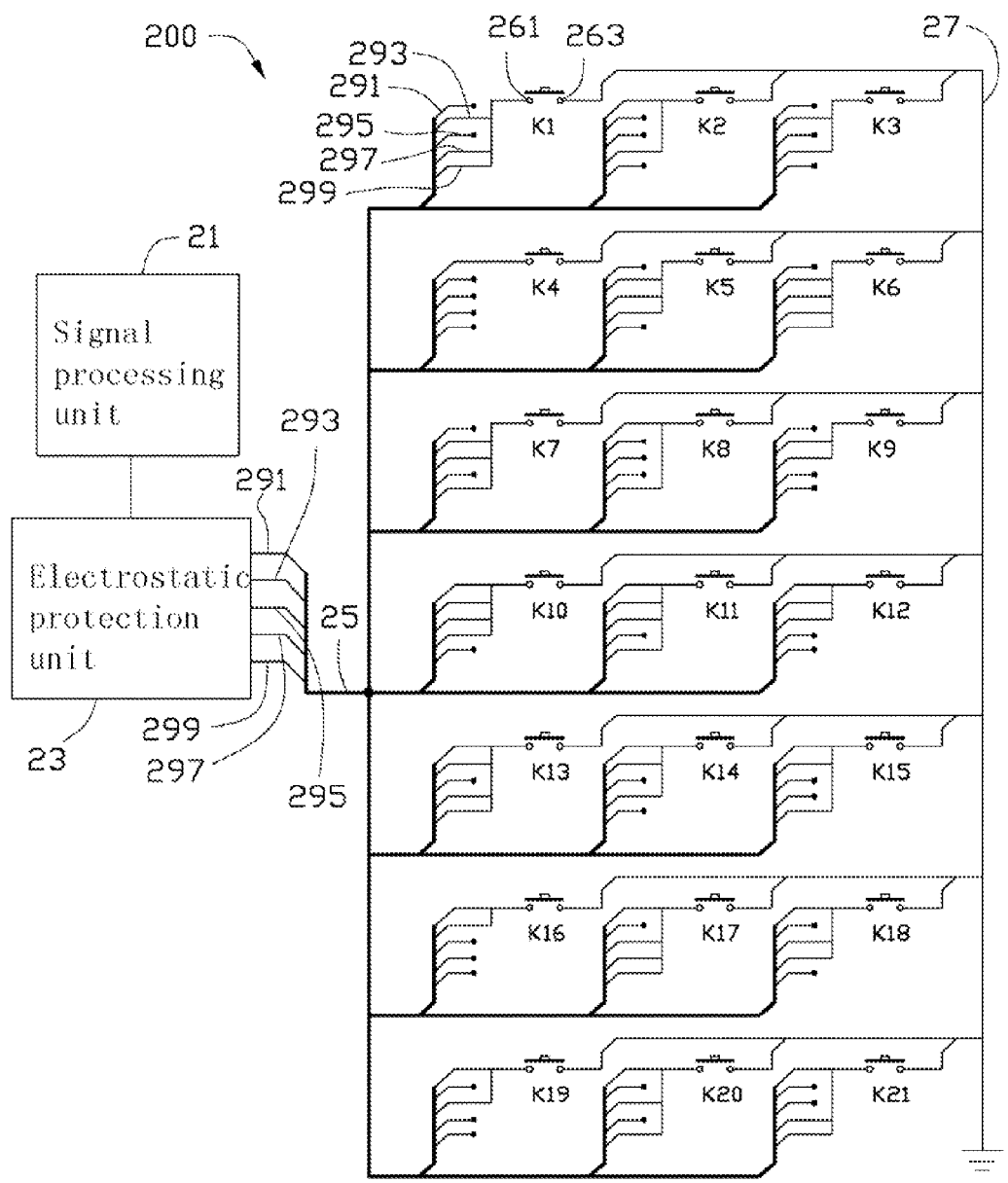
FIG. 1 is a schematic view of a key coding circuit, according to an exemplary embodiment of the disclosure.

FIG. 1 shows a key coding circuit 200 including keys K1-K21, a signal processing unit 21, an electrostatic protection unit 23, a first bus 25, and a first ground wire 27. The signal processing unit 21 can be integrated with the central processing unit (CPU) of an electronic device and is electrically connected to the electrostatic protection unit 23. The electrostatic protection unit 23 may be an existing electrostatic protection chip and includes a first signal line 291, a second signal line 293, a third signal line 295, a fourth signal line 297, and a fifth signal line 299.

The first signal line 291, the second signal line 293, the third signal line 295, the fourth line 297, and the fifth signal line 299 are electrically connected to the first bus 25 and each key. Each key includes a first input end 261 and a first ground end 263. Each first input end 261 is electrically connected to at least one signal line, and all the first ground ends 263 of the keys are electrically connected to the first ground wire 27.

The keys K1-K21 correspond to binary codes as shown in table 1-1:

TABLE 1-1

| key | Code |
|---|---|
| K1 | 10100 |
| K2 | 01101 |
| K3 | 10101 |
| K4 | 01111 |
| K5 | 10001 |
| K6 | 10000 |
| K7 | 10010 |
| K8 | 01110 |
| K9 | 10011 |
| K10 | 00001 |
| K11 | 00010 |
| K12 | 00011 |
| K13 | 00100 |
| K14 | 00101 |
| K15 | 00110 |
| K16 | 00111 |
| K17 | 01000 |
| K18 | 01001 |
| K19 | 01011 |
| K20 | 01010 |
| K21 | 01100 |

When the signal lines are floating, the codes are set as 1, and the signal lines corresponding to binary code 0 are electrically connected to the first input end 261.

In use, the signal processing unit 21 of the key coding circuit 200 provides high levels 1 to the first signal line 291, the second signal line 293, the third signal line 295, the fourth line 297, and the fifth signal line 299 through the electrostatic protection unit 23. When any key is used, the used key is switched on, and the first input end 261 is electrically connected with the first ground end 263. The levels of the signal lines connected to the first input end 261 are then changed from high to low. The signal processing unit 21 detects the level changes of corresponding signal lines, resulting in generation of an interrupt signal, and then successively scans the first signal line 291, the second signal line 293, the third signal line 295, the fourth signal line 297, and the fifth signal line 299 by using corresponding control programs.

For example, when the key K10 is used, the first input end 261 is electrically connected to the first ground end 263, then the levels of the first signal line 291, the second signal line 293, the third signal line 295, the fourth signal line 297 are changed from high level 1 into low level 0, and the fifth signal line 299 are floating and still keeps high level 1. The signal processing unit 21 successively scans the first signal line 291, the second signal line 293, the third signal line 295, the fourth signal line 297, and the fifth signal line 299 to obtain the corresponding codes 0, 0, 0, 0, and 1. Thus, the key K10 can be confirmed and located as the used one to execute corresponding operation.

The key coding circuit 200 successively scans only five signal lines to obtain a total 21 corresponding codes of the signal lines, resulting in confirmation of the used key, reducing the scan time.

Figure 2A:
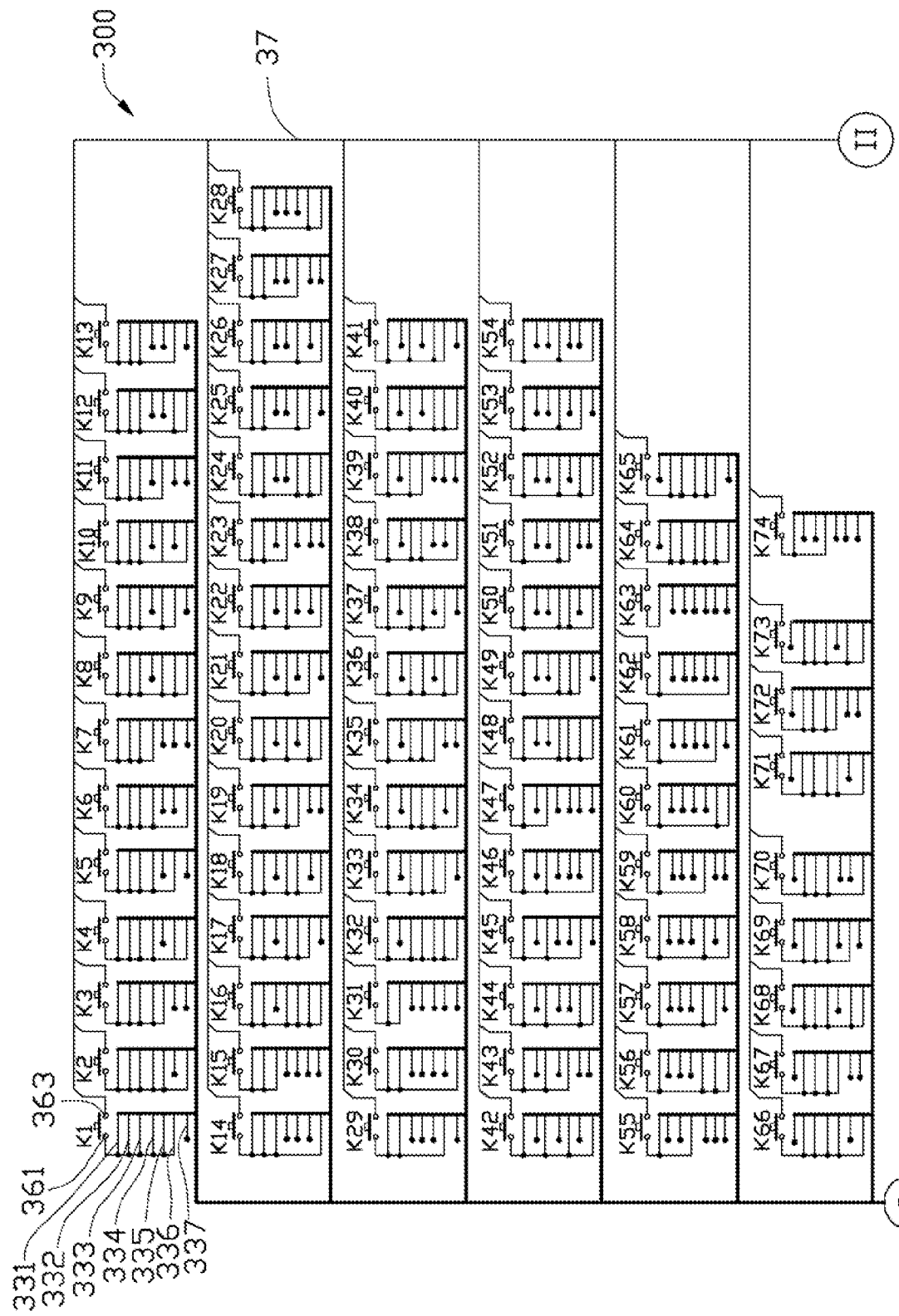
FIGS. 2A-2B are schematic views of a key coding circuit, according to another exemplary embodiment of the disclosure.
Figure 2B:
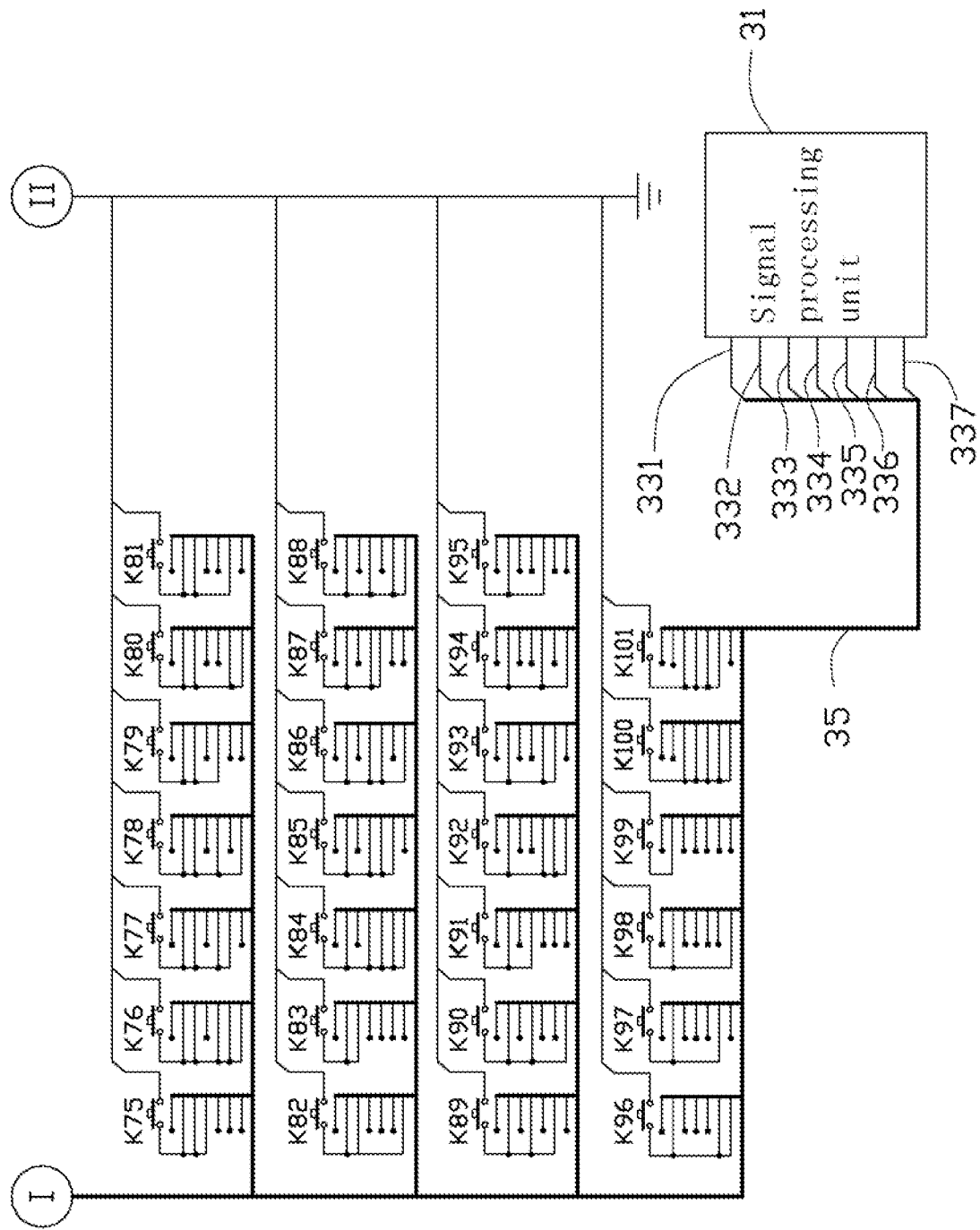
Figure 3:
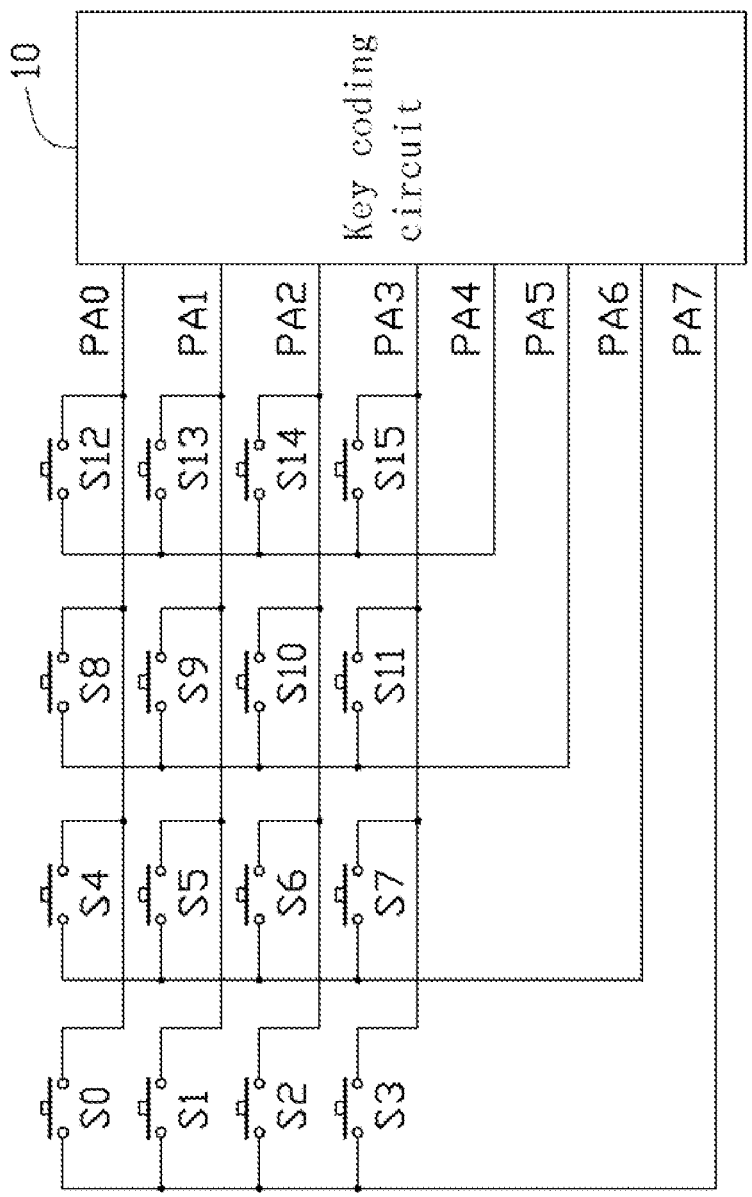
FIG. 3 is a schematic view of an existing matrix key circuit.

FIGS. 2A and 2B show another exemplary embodiment of a key coding circuit 300, the key coding circuit 300 including a plurality of keys K1-K101, a signal processing unit 31, a second bus 35, and a second ground wire 37. The signal processing unit 31 can be integrated with the CPU of the mobile phone and includes a sixth signal line 331, a seventh signal line 332, an eighth signal line 333, a ninth signal line 334, a tenth signal line 335, an eleventh signal line 336, and a twelfth signal line 337.

The sixth signal line 331, the seventh signal line 332, the eighth signal line 333, the ninth signal line 334, the tenth signal line 335, the eleventh signal line 336, and the twelfth signal line 337 are electrically connected to the second bus 35 and corresponding keys. Each key includes a second input end 361 and a second ground end 363. Each second input end 361 is electrically connected to at least one signal line, and all the second ground ends 363 are electrically connected to the second ground wire 37.

The keys K1-K101 correspond to binary codes as shown in table 1-2:

TABLE 1-2

| key | code |
|---|---|
| K1 | 0000001 |
| K2 | 0000010 |
| K3 | 0000011 |
| K4 | 0000100 |
| K5 | 0000101 |
| K6 | 0000110 |
| K7 | 0000111 |
| K8 | 0001000 |
| K9 | 0001001 |
| K10 | 0001010 |
| K11 | 0001011 |
| K12 | 0001100 |
| K13 | 0001101 |
| K14 | 0001110 |
| K15 | 0001111 |
| K16 | 0010000 |
| K17 | 0010001 |
| K18 | 0010010 |
| K19 | 0010011 |
| K20 | 0010100 |
| K21 | 0010101 |
| K22 | 0010110 |
| K23 | 0010111 |
| K24 | 0011000 |
| K25 | 0011001 |
| K26 | 0011010 |
| K27 | 0011011 |
| K28 | 0011100 |
| K29 | 0011101 |
| K30 | 0011110 |
| K31 | 0011111 |
| K32 | 0100000 |
| K33 | 0100001 |
| K34 | 0100010 |
| K35 | 0100011 |
| K36 | 0100100 |
| K37 | 0100101 |
| K38 | 0100110 |
| K39 | 0100111 |
| K40 | 0101000 |
| K41 | 0101001 |
| K42 | 0101010 |
| K43 | 0101011 |
| K44 | 0101100 |
| K45 | 0101101 |
| K46 | 0101110 |
| K47 | 0101111 |
| K48 | 0110000 |
| K49 | 0110001 |
| K50 | 0110010 |
| K51 | 0110011 |
| K52 | 0110100 |

TABLE 1-2-continued

| key | code |
|---|---|
| K53 | 0110101 |
| K54 | 0110110 |
| K55 | 0110111 |
| K56 | 0111000 |
| K57 | 0111001 |
| K58 | 0111010 |
| K59 | 0111011 |
| K60 | 0111100 |
| K61 | 0111101 |
| K62 | 0111110 |
| K63 | 0111111 |
| K64 | 1000000 |
| K65 | 1000001 |
| K66 | 1000010 |
| K67 | 1000011 |
| K68 | 1000100 |
| K69 | 1000101 |
| K70 | 1000110 |
| K71 | 1000010 |
| K72 | 1000011 |
| K73 | 1000100 |
| K74 | 0110111 |
| K75 | 1000111 |
| K76 | 1001000 |
| K77 | 1001001 |
| K78 | 1001010 |
| K79 | 1001011 |
| K80 | 1001100 |
| K81 | 1001101 |
| K82 | 1001110 |
| K83 | 1001111 |
| K84 | 1010000 |
| K85 | 1010001 |
| K86 | 1010010 |
| K87 | 1010011 |
| K88 | 1010100 |
| K89 | 1010101 |
| K90 | 1010110 |
| K91 | 1010111 |
| K92 | 1011000 |
| K93 | 1011001 |
| K94 | 1011010 |
| K95 | 1011011 |
| K96 | 1011100 |
| K97 | 1011101 |
| K98 | 1011110 |
| K99 | 1011111 |
| K100 | 1100000 |
| K101 | 1100001 |

Similarly, when the signal lines are floating, the corresponding codes of signal lines are set as 1, and the signal lines corresponding to binary code 0 are electrically connected to the second input end 361.

In use, the signal processing unit 31 of the key coding circuit 200 provides high levels 1 to the sixth signal line 331, the seventh signal line 332, the eighth signal line 333, the ninth signal line 334, the tenth signal 335, the eleventh signal line 336, and the twelfth signal line 337. When any key is used, the used key is switched on, and the second input end 361 is electrically connected to the second ground end 363. The levels of the signal lines connected to the second input end 361 are then changed from high to low. The signal processing unit 31 detects the level changes of corresponding signal lines, resulting in generation of an interrupt signal, and then successively scans the sixth signal line 331, the seventh signal line 332, the eighth signal line 333, the ninth signal line 334, the tenth signal 335, the eleventh signal line 336, and the twelfth signal line 337 by using corresponding control programs.

For example, when the key K1 is used, the second input end 361 is electrically connected to the second ground end 363, then the levels of the sixth signal line 331, the seventh signal line 332, the eighth signal line 333, the ninth signal line 334, the tenth signal line 335, and the eleventh signal line 336 are changed from high level 1 into low level 0, and the twelfth signal line are floating and maintains high level 1. The signal processing unit 31 then successively scans the all the signal lines to obtain corresponding codes 0, 0, 0, 0, 0, 0, and 1. Thus, the key K1 can be confirmed and located as that used to execute corresponding operation.

The key coding circuit 300 successively scans just seven signal lines to obtain 101 corresponding codes of the signal lines, resulting in confirmation of the used key, reducing the scan time.

Electrostatics generated when the keys are operated may damage the CPU and other elements due to the small space between the mobile phone keys and the circuit board of the mobile phone, so that the electrostatic protection chip is needed to protect the CPU. Moreover, compared to the mobile phone keys, there is ample space between the computer keys and the circuit board, so that a small amount of static electricity cannot affect the CPU. Therefore, there may be no need to set the electrostatic protection chip in the computer key coding circuit.

It is to be understood, however, that even though numerous characteristics and advantages of the exemplary disclosure have been set forth in the foregoing description, together with details of the structure and function of the exemplary disclosure, the disclosure is illustrative only, and changes may be made in detail, especially in matters of shape, size, and arrangement of parts within the principles of exemplary disclosure to the full extent indicated by the broad general meaning of the terms in which the appended claims are expressed.

What is claimed is:

1. A key coding circuit, comprising:
   a ground wire;
   N keys, each key comprising an input end and a ground end electrically connected to the ground wire;
   a signal processing unit comprising M signal lines, M being the smallest positive whole number not less than Log(N+1, 2), and at least one signal line electrically connected to the corresponding input end; and
   a bus electrically connected to the signal lines, wherein each key is coded for M-bit binary, the floating signal lines correspond to the binary code 1, and the signal lines corresponding to binary code 0 are electrically connected to the input end of the corresponding keys.

2. The key coding circuit as claimed in claim 1, further comprising an electrostatic protection unit electrically connected to the signal processing unit, the electrostatic protection unit discharging electrostatic buildup and protecting the signal processing unit.

3. The key coding circuit as claimed in claim 1, wherein the signal processing unit provides high levels to the signal lines, when any key is used, the input end then is electrically connected to the ground end.

4. The key coding circuit as claimed in claim 3, wherein when the key is used, the levels of the signal lines connected to the input end are changed from high to low, and the signal processing unit detects the level changes of corresponding signal lines, and successively scans the signal lines to obtain corresponding codes.

5. A key coding circuit, comprising:
   a ground wire;
   N keys, each key comprising an input end and a ground end, the ground end electrically connected to the ground wire;
   an electrostatic protection unit for discharging static electricity comprising M signal lines, M being the smallest positive whole number not less than Log(N+1, 2), and at least one signal line electrically connected to the corresponding input end;
   a bus electrically connected to the signal line for transmitting level signals; and
   a signal processing unit electrically connected to the electrostatic protection unit, wherein each key is coded for M-bit binary, the floating signal lines correspond to the binary code 1, the signal lines corresponding to binary code 0 are electrically connected to the input end of the corresponding keys, and the signal processing unit scans signal lines to obtain corresponding codes.

6. The key coding circuit as claimed in claim 5, wherein the signal processing unit provides high levels to the signal lines, when any key is used, the input end then is electrically connected to the ground end.

7. The key coding circuit as claimed in claim 6, wherein when the key is used, the levels of the signal lines connected to the input end are changed from high to low, and the signal processing unit detects the level changes of corresponding signal lines, and successively scans the signal lines to obtain corresponding codes.

* * * * *